United States Patent
Nakase

(10) Patent No.: US 9,992,872 B2
(45) Date of Patent: Jun. 5, 2018

(54) TOUCH SENSOR, TOUCH PANEL, AND ELECTRONIC DEVICE

(71) Applicant: SMK Corporation, Tokyo (JP)

(72) Inventor: Takayuki Nakase, Toyama (JP)

(73) Assignee: SMK Corporation, Tokyo (JP)

( * ) Notice: Subject to any disclaimer, the term of this patent is extended or adjusted under 35 U.S.C. 154(b) by 171 days.

(21) Appl. No.: 15/187,798

(22) Filed: Jun. 21, 2016

(65) Prior Publication Data

US 2017/0160826 A1 Jun. 8, 2017

(30) Foreign Application Priority Data

Dec. 3, 2015 (JP) ................................ 2015-236423

(51) Int. Cl.
| | |
|---|---|
| *H05K 1/14* | (2006.01) |
| *G06F 3/041* | (2006.01) |
| *G06F 3/044* | (2006.01) |
| *H05K 1/02* | (2006.01) |

(52) U.S. Cl.
CPC ........... *H05K 1/147* (2013.01); *G06F 3/0416* (2013.01); *G06F 3/044* (2013.01); *G06F 2203/04102* (2013.01); *H05K 1/028* (2013.01); *H05K 2201/10189* (2013.01)

(58) Field of Classification Search
CPC .. G06T 11/60; H04N 1/00493; G02B 27/017; G02B 2027/014; G02B 27/0172
See application file for complete search history.

(56) References Cited

U.S. PATENT DOCUMENTS

| | | | |
|---|---|---|---|
| 7,746,439 B2 * | 6/2010 | Kohno | G02F 1/13452 349/150 |
| 2012/0098774 A1 * | 4/2012 | Abe | G02F 1/133308 345/173 |
| 2013/0050115 A1 | 2/2013 | Oohira | |
| 2014/0063364 A1 | 3/2014 | Hirakata | |
| 2014/0240985 A1 * | 8/2014 | Kim | H05K 1/028 362/249.04 |
| 2015/0173171 A1 * | 6/2015 | Kim | H05K 1/028 361/749 |
| 2015/0289363 A1 * | 10/2015 | Otsubo | H05K 1/028 361/749 |
| 2016/0322724 A1 * | 11/2016 | Lee | H01R 12/771 |

FOREIGN PATENT DOCUMENTS

WO 2014/045562 A1 3/2014

OTHER PUBLICATIONS

Office Action issued for counterpart Japanese Application 2015-236423, issued by the Japan Patent Office dated Sep. 13, 2017.

* cited by examiner

*Primary Examiner* — Bryan Earles

(57) ABSTRACT

An object of the present invention is to allow a connector tail connected to a curved place to be naturally folded. A touch sensor includes: a sensor unit that is curved at least at a peripheral edge; and a connector tail in which a first connection part having a first end portion connected to the sensor unit and a second connection part having a second end portion connected to a connector are continuously formed. The connector tail is configured such that the second connection part extends relative to the first connection part curved in accordance with the curve of the peripheral edge of the sensor portion in a direction in which the curved shape of the first connection part is canceled out.

7 Claims, 5 Drawing Sheets

TOUCH SENSOR, TOUCH PANEL, AND ELECTRONIC DEVICE

CROSS REFERENCE TO RELATED APPLICATION

The contents of the following Japanese patent application are incorporated herein by reference,
Japanese Patent Application No. 2015-236423 filed on Dec. 3, 2015.

FIELD

The present invention relates to a touch sensor, a touch panel, and an electronic device.

BACKGROUND

In recent years, there have been widely prevalent touch panels (also called touch screens) with touch sensors disposed for detecting operation inputs on display elements such as liquid crystal display elements or the like included in mobile terminals, cellular phones, car navigation systems, and others. In addition, there have also been proposed curved touch panels with curved input areas called 2.5D, 3D, or the like. For example, WO No. 2014/045562 describes a touch panel with a curved touch sensor that detects an input position based on changes in the capacitance of an electrode.

SUMMARY

In general, a touch sensor is connected to a flat plate-like conductor (hereinafter, called connector tail as appropriate) for extracting signals to the outside. The connector tail is also called flexible tail, lead wire, tail conductor, tail, or the like. The connector tail is folded at an angle of about 180 degrees, for example, and its front end is connected to a connector on a printed wired board (PWB) on the back side of the touch sensor.

As described in WO No. 2014/045562, when the touch sensor is curved, the connector tail connected to the touch sensor is also curved integrally. When the connector tail is curved, it may be difficult to fold naturally the connector tail and insert naturally the front end of the connector tail into the connector on the printed wired board.

An object of the present invention is to provide a novel and useful touch sensor, touch panel, and electronic device for solving the foregoing problem.

To solve the foregoing problem, for example, an aspect of the present invention is a touch sensor including: a sensor unit that is curved at least at a peripheral edge; and a connector tail in which a first connection part having a first end portion connected to the sensor unit and a second connection part having a second end portion connected to a connector are continuously formed, wherein the connector tail is configured such that the second connection part extends relative to the first connection part curved in accordance with the curve of the peripheral edge of the sensor portion in a direction in which the curved shape of the first connection part is canceled out.

The first connection part may extend in a direction along a curved axis on which the sensor unit is curved, and the second connection part may have at least a portion extending in a direction not along the curved axis.

The second connection part may further have another portion that is formed continuously on the portion and extends in the direction along the curved axis.

A predetermined electronic component may be mounted on the second connection part.

The sensor unit may have flexibility and may be entirely curved.

Another aspect of the present invention may be a touch panel that includes the touch sensor of the aspect of the present invention and an external member that holds the sensor unit of the touch sensor and has a curved shape.

Another aspect of the present invention may be an electronic device including the touch panel of the aspect of the present invention.

According to at least one aspect of the present invention, it is possible to fold naturally the connector tail connected to the curved place. The contents of the present invention are not interpreted in a limited sense by the advantageous effect described herein.

DESCRIPTION OF EMBODIMENTS

Figure 1:
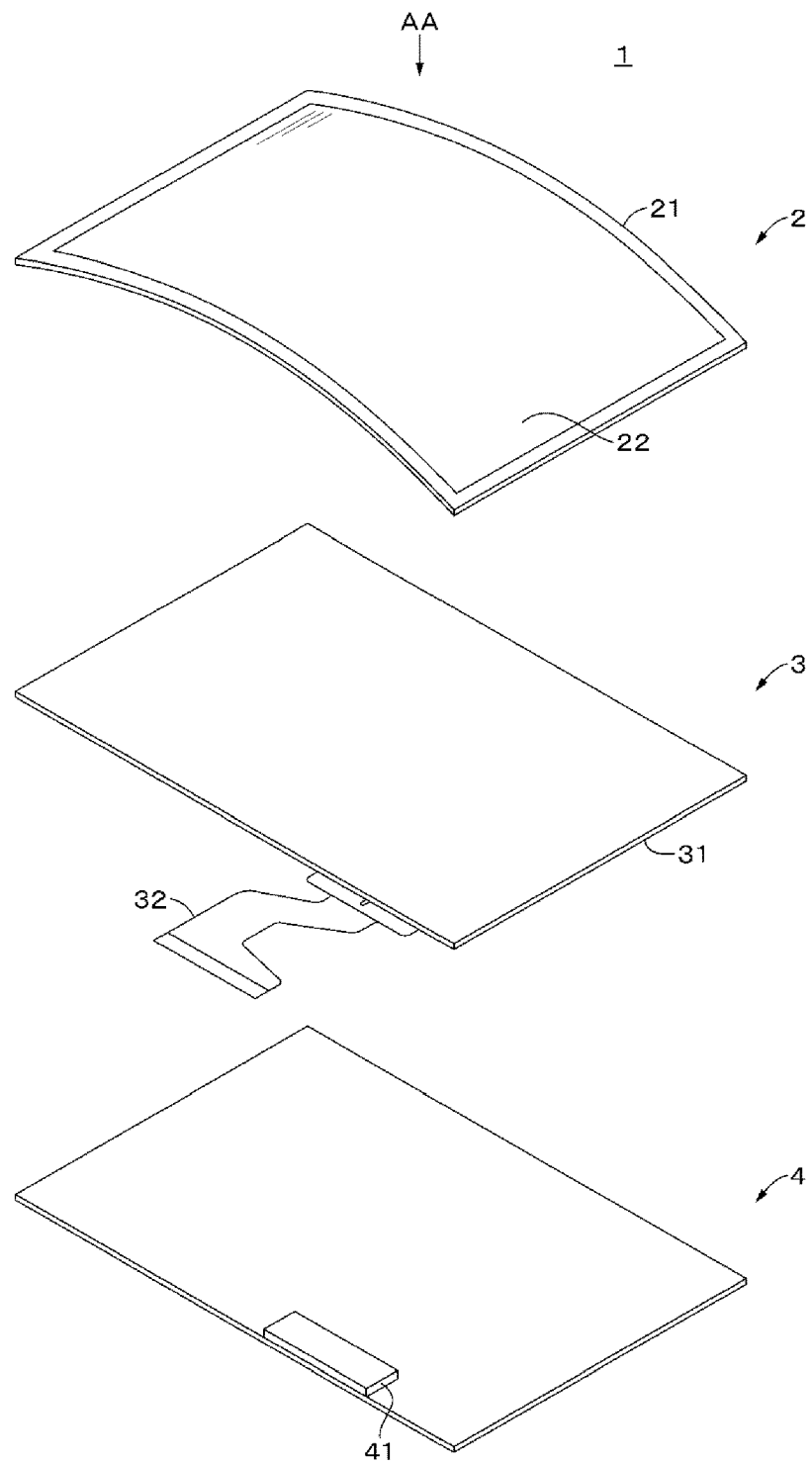
FIG. 1 is a partially exploded perspective view illustrating a configuration example of a touch panel according to an embodiment of the present invention.

An embodiment and the like of the present invention will be described below with reference to the drawings. The descriptions will be given in the following order:
<1. Embodiment>
<2. Modification Example>

The embodiment and the like described below are intended to exemplify a configuration for embodying the technical idea of the present invention, but the present invention is not limited to the exemplified configuration. The members described in the claims are not limited to the members of the embodiment. In particular, unless otherwise specified, the descriptions of the dimensions, materials, shapes, relative positions, upper, lower, right and left sides of constituent members of the embodiment are not intended to limit the scope of the present invention, but are merely explanatory examples. The sizes of the members and the positional relationships among them may be exaggerated in the drawings for the purpose of clear illustration. In addition, only some of the reference signs may be shown in the drawings to prevent complexity. In the following descriptions, the same designations and reference signs will refer to the same or equivalent members, and overlapped explanation will be omitted as appropriate. Of the respective elements of the present invention, a plurality of elements may be formed by one and the same member such that the member serves as the plurality of elements, or the function of one member may be divided among a plurality of members.

Figure 2:
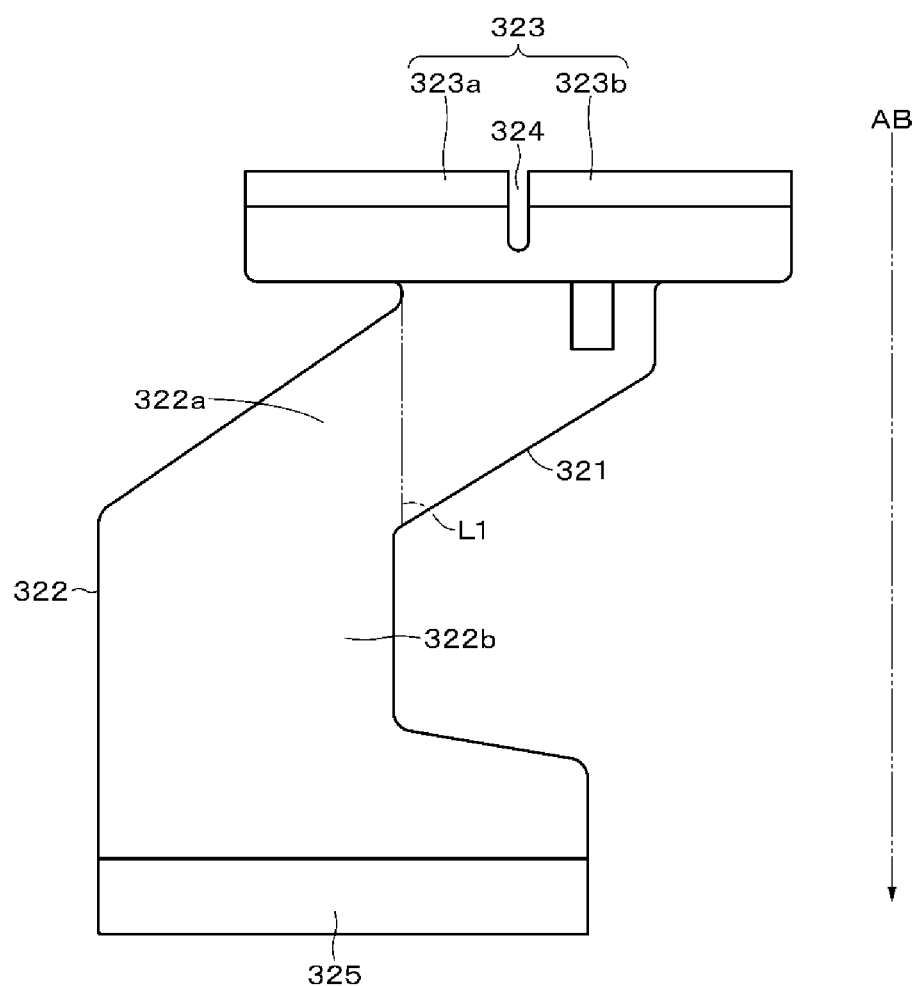
FIG. 2 is a diagram illustrating a connector tail according to the embodiment of the present invention.
Figure 5:
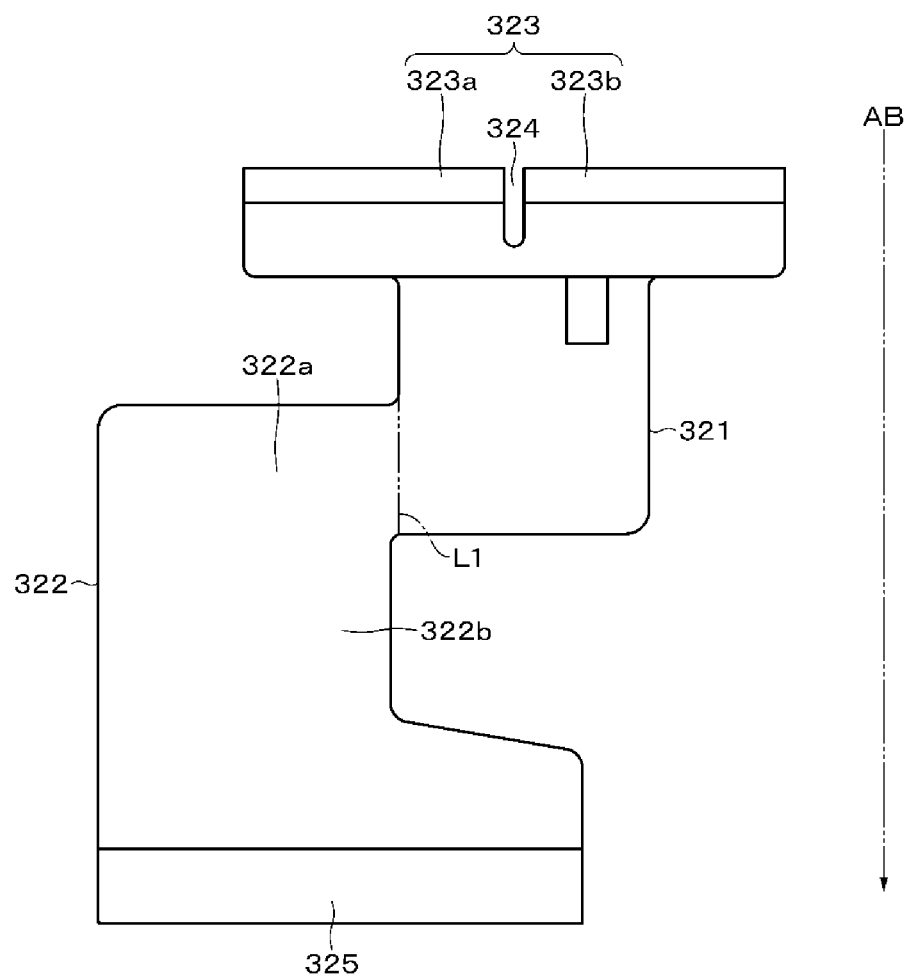
FIG. 5 is a diagram for describing a modification example.

The term "curved axis" herein refers to an axis passing through the center of a circle approximated to the local curve of the curved shape and being orthogonal to the circle (plane) or an axis parallel to the former axis. FIGS. 2 and 5 show an example of curved axis with reference sign AB by two-dot chain line.

<1. Embodiment>

[Schematic Configuration Example of a Touch Panel]

A touch panel to which a touch sensor according to an embodiment of the present invention is applied (touch panel 1) will be described as an example. The touch panel 1 is used as an input device for various electronics such as mobile terminals, cellular phones, and car navigation systems. For example, the touch panel of the embodiment is a capacitive touch panel that has a large number of electrodes disposed along an input operation area on an insulated substrate, detects an electrode with a change in capacitance between detection electrodes due to the approach of an input operation body such as a finger, and determines the input operation position from the position of the electrode, but is not limited to this.

FIG. 1 is a partially exploded perspective view of the touch panel 1. The touch panel 1 is configured such that an external member 2, a touch sensor 3, and a wiring substrate 4 as an example of a control substrate are arranged on a front side (upper side in FIG. 1) in this order along a direction with respect to an input operation direction AA of the touch panel 1. The touch panel 1 has a display unit of liquid crystal, organic electro luminescence (EL), or the like between the touch sensor 3 and the wiring substrate 4, for example, but FIG. 1 and others do not illustrate it.

The external member 2 has a frame-like insulation case 21 made of resin, plastic, or the like. The inside of the opening (frame) of the insulation case 21 is set as an area capable of operation input into the touch panel 1. A protective cover 22 made of a transparent plastic material or film of acryl or ABS is provided in the inside of the opening of the insulation case 21. In this manner, the external member 2 is configured such that the insulation case 21 and the protective cover 22 are integrated. The external member 2 has a slightly convex-curved shape as a whole formed by curving longitudinally a rectangular plate in an arc taking designability into consideration. The external member 2 may be formed by molding integrally the parts for the insulation case 21 and the protective cover 22 from a transparent plastic material and then making prints on the part for the insulation case 21.

The touch sensor 3 has a sensor unit 31 and a connector tail 32 with one end attached to the peripheral edge of the sensor unit 31 in a predetermined position. The touch sensor 3 is curved in the same manner as the external member 2 and is held by the external member 2. For example, the external member 2 may have two curved plates that sandwich the touch sensor 3, or the touch sensor 3 is bonded to the back surface of the external member 2 by an adhesive tape or a bonding layer such as an adhesive layer.

The sensor unit 31 has flexibility and is deformable in an arbitrary shape. Although not illustrated in detail, the sensor unit 31 has a bonded structure in which transparent electrode patterns are formed in X and Y directions on two base materials and the two base materials are bonded together. The transparent electrode patterns may be ITO (Indium Tin Oxide) films. Lead patterns as transparent silver patterns are printed on the electrodes. The base materials may be glass sheets or films as an example.

The connector tail 32 is configured such that a copper-foil wiring pattern is formed on an insulating tail base material such as polyimide or polyethylene terephthalate (PET), and a tail protective sheet material covers the tail base material. The connector tail 32 is generally thin plate-like as a whole and has flexibility enough to be folded. The connector tail 32 has at one end a connection pattern (not illustrated) with a wiring pattern exposed. When the connection pattern is thermally compressed and bonded with lead patterns derived from the electrodes of the sensor unit 31 via an anisotropic conductive film, the sensor unit 31 and the connector tail 32 are electrically connected together. The connector tail 32 has the other end inserted into and connected to an FPC connector on the wiring substrate 4 via an insertion opening. The detailed shape of the connector tail 32 will be described later.

The FPC connector 41 for connection with the other end of the connector tail 32 is formed (mounted) on the front surface of the wiring substrate 4 near the peripheral edge. The FPC connector 41 may be formed on the back surface of the wiring substrate 4. Although not illustrated, the wiring substrate 4 has therein an arithmetic operation unit that processes a signal obtained by the touch sensor 3 to detect the operation input position, a display controller that controls display on the display unit (or a one-chip IC (integrated circuit) controller having the same function), an interface with a processing device executing a control according to the operation input position, and others.

[Example of Shape of the Connector Tail]

FIG. 2 is a diagram illustrating an example of shape of the connector tail 32. The connector tail 32 is generally shaped such that a first connection part 321 and a second connection part 322 defined by a virtual line L1 relative to the first connection part 321 are continuously formed. Although the details will be described later, the second connection part 322 extends in a direction that cancels out the curved shape of the first connection part 321, in other words, in a direction that cancels out the curvature of the first connection part 321 (approaching zero or just about zero). Therefore, the line L1 defining the first and second connection parts 321 and 322 can also be called curvature cancel line for canceling out the curvature generated in the first connection part 321.

The first connection part 321 has a first end portion 323. The connection pattern described above is formed on the first end portion 323. The first end portion 323 is connected to the lead patterns at the peripheral edge of the sensor unit 31 via the anisotropic conductive film. Further, in the embodiment, the first end portion 323 has a slit 324 near the middle, and the slit 324 divides the first end portion 323 into end portions 323*a* and 323*b*. For example, the one end portion 323*a* is connected to the lead pattern of the transparent electrode pattern in the X-axis direction, and the other end portion 323*b* is connected to the lead pattern of the transparent electrode pattern in the Y-axis direction.

In the plan view of FIG. 2, the second connection part 322 has a bending portion 322*a* that extends obliquely downward with respect to the first end portion 323. Via the bending portion 322*a*, a non-bending portion 322*b* of the second connection part 322 including a plane approximately parallel to the first connection part 321 and the first connection part 321 are continuously formed. The second connection part 322 also has at its front end a second end portion 325 inserted into the FPC connector 41 of the wiring substrate 4.

[Example of Attachment of the Touch Sensor]

Figure 3:
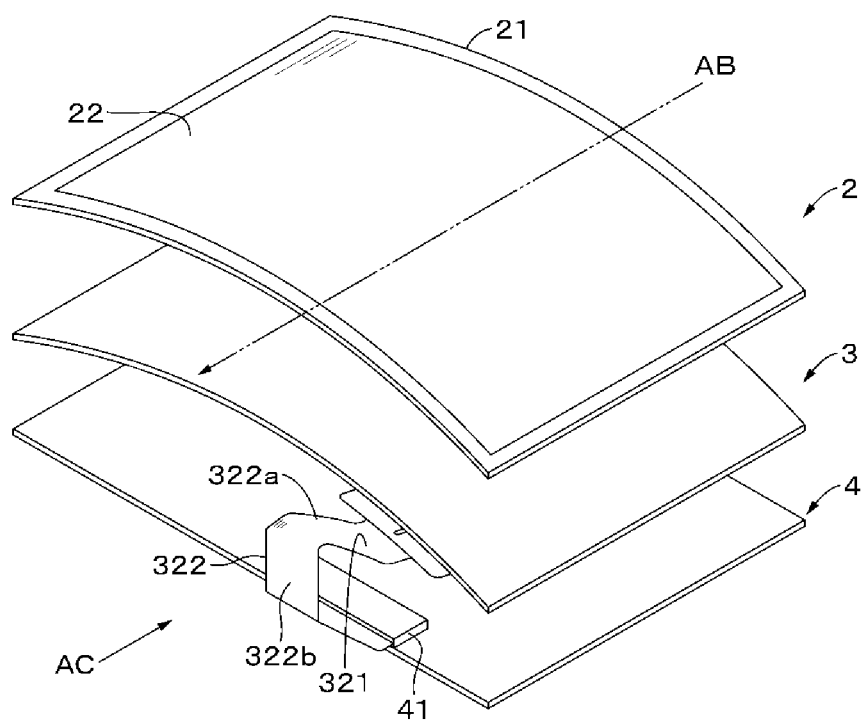
FIG. 3 is a diagram for describing an example of attachment of a touch sensor to an external member according to the embodiment of the present invention.
Figure 4:
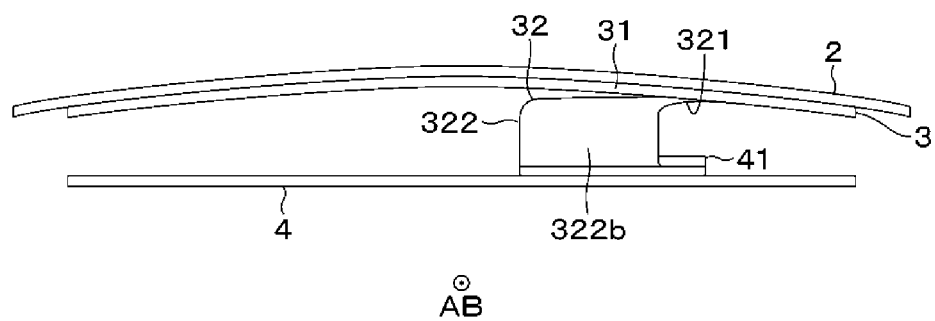
FIG. 4 is a diagram for describing the example of attachment of the touch sensor to the external member according to the embodiment of the present invention.

Next, an example of attachment of the touch sensor 3 to the external member 2 will be described with respect to FIGS. 3 and 4. FIG. 4 is a view of the touch panel 1 seen from one side (in AC direction in FIG. 3). The sensor unit 31 of the touch sensor 3 connects in advance to the first end portion 323 of the connector tail 32.

The sensor unit 31 is attached to the back surface of the external member 2 by an appropriate method along the curved shape of the external member 2. When being attached to the external member 2, the sensor unit 31 curves in accordance with the shape of the external member 2.

When the sensor unit 31 curves, part of the connector tail 32 also curves in accordance with the curve of the peripheral edge of the sensor unit 31. Specifically, when the peripheral edge of the sensor unit 31 curves, the first end portion 323 curves and the entire first connection part 321 curves accordingly. That is, when a curving force acts on the plane of the sensor unit 31 extending in a direction along the curved axis, the first connection part 321 extending in the direction along the curved axis curves.

Meanwhile, the curving force applied to the first connection part 321 does not act on the bending portion 322a having the plane extending in a direction not along the curved axis of the sensor unit 31. Accordingly, the second connection part 322 does not curve following the deformation of the first connection part 321.

The second connection part 322 further has the non-bending portion 322b as a plane extending in the direction along the curved axis of the sensor unit 31. As described above, the curving force does not act on the portion extending forward from the bending portion 322a, and therefore the non-bending portion 322b becomes flat. For example, the connector tail 32 can be naturally folded at a predetermined place in the non-bending portion 322b. Accordingly, when the connector tail 32 is folded, the end surface of the second end portion 325 and the insertion opening of the FPC connector 41 are opposed to each other. In that state, the second end portion 325 can be naturally inserted into the FPC connector 41 without an excessive load.

<2. Modification Example>

The embodiment of the present invention has been specifically described so far. However, the present invention is not limited to the foregoing embodiment but can be modified in various manners.

The shape of the connector tail 32 is not limited to the one described above in relation to the embodiment. For example, as illustrated in FIG. 5, the bending portion 322a of the second connection part 322 may have a plane approximately orthogonal to the first connection part 321.

In the foregoing embodiment, the entire sensor unit 31 curves. Alternatively, part (at least the peripheral edge) of the sensor unit 31 may curve. The sensor unit 31 may not necessarily have flexibility but the entire sensor unit 31 or at least its peripheral edge may curve independently. In this case, the sensor unit 31 includes two base materials curving in an independent manner. In addition, the sensor unit 31 may not have a bonding structure but may have a single-sided lamination structure in which transparent electrode patterns in the X and Y directions are formed on the single side of one base material.

A predetermined electronic component such as a controller IC may be mounted on the second connection part 322 (for example, on the non-bending portion 322b) of the connector tail 32 (also called chip-on-film). When an electronic component is mounted on a land at a place with a curvature, the bonding state becomes likely to be unstable and the electronic component may become separated. However, according to the embodiment of the present invention described above, even when one end of the connector tail 32 is attached at a curved place, the flat portion such as the second connection part 322 can be formed to allow stable mounting of the electronic component.

The attachment process may be changed as appropriate such that the connector tail 32 is connected in advance to the FPC connector 41, and the touch sensor 3 and the wiring substrate 4 are integrated and attached to the external member 2.

In the foregoing embodiment, the entire external member 2 curves. Alternatively, part of the external member 2 may curve and the present invention is also applicable to this case. In addition, the external member 2 may be decorated as appropriate according to the use application of the touch panel 1. The protective cover 22 has light permeability to make visible the contents appearing on the display unit. The protective cover 22 may not be provided.

The external member 2, the touch sensor 3, and the display unit may be cylindrical in shape. The wiring substrate 4 may be disposed near the center of the cylindrical member. The present invention is also applicable to touch sensors and others for use in cylindrical displays or other displays of arbitrary shape. The first connection part 321 can deform in accordance with the shape of the deformed sensor unit 31 (for example, circular or oval shape). The shape of the deformed first connection part 321 is not limited to a curved shape.

The configurations, methods, processes, shapes, materials, and numeric values described above in relation to the embodiment and the modification example are mere examples, and any other configurations, methods, processes, shapes, materials, and numeric values may be used as necessary or may be replaced with publicly known ones. The configurations, methods, processes, shapes, materials, and numeric values of the embodiment and the modification example can be combined together unless any technical conflict occurs.

Further, the present invention is not limited to a touch panel but can be carried out in any mode such as electronic devices including touch sensors and touch panels.

REFERENCE SIGNS LIST

1 Touch panel
2 External member
3 Touch sensor
4 Wiring substrate
31 Sensor unit
32 Connector tail
321 First connection part
322 Second connection part
323 First end portion
325 Second end portion
323a and 323b End portion
41 FPC connector
AA Input operation direction
AB Curved axis

The invention claimed is:
1. A touch sensor comprising:
a sensor unit that is curved at least at a peripheral edge; and
a connector tail in which a first connection part having a first end portion connected to the sensor unit and a second connection part having a second end portion connected to a connector are continuously formed, wherein
the first connection part is separated from the second connection part by a straight curvature cancel line, and
the connector tail is configured such that the second connection part extends non-bending relative to the first connection part, and the first connection part curves in accordance with the curve of the peripheral edge of the sensor unit up to the straight curvature cancel line, the straight curvature cancel line cancelling out the curve of the first connection part.

2. The touch sensor according to claim 1, wherein
the first connection part extends in a direction along a curved axis on which the sensor unit is curved, and
the second connection part has at least a portion extending in a direction not along the curved axis.

3. The touch sensor according to claim 2, wherein
the second connection part further has another portion that is formed continuously on the portion and extends in the direction along the curved axis.

4. The touch sensor according to claim 1, wherein a predetermined electronic component is mounted on the second connection part.

5. The touch sensor according to claim 1, wherein the sensor unit has flexibility and is entirely curved.

6. A touch panel comprising:
the touch sensor according to claim 1; and
an external member that holds the sensor unit of the touch sensor and has a curved shape.

7. An electronic device comprising the touch panel according to claim 6.

* * * * *